US012406894B2

(12) United States Patent
Gatto

(10) Patent No.: US 12,406,894 B2
(45) Date of Patent: Sep. 2, 2025

(54) SEMICONDUCTOR DEVICE INCLUDING FIRST AND SECOND SEMI-INSULATING LAYERS

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/913,330

(22) Filed: Jun. 26, 2020

(65) Prior Publication Data
US 2021/0125889 A1    Apr. 29, 2021

(30) Foreign Application Priority Data
Oct. 25, 2019    (JP) .................................. 2019-194002

(51) Int. Cl.
*H10D 64/00*    (2025.01)
*H01L 23/29*    (2006.01)
(Continued)

(52) U.S. Cl.
CPC ........ *H01L 23/3192* (2013.01); *H01L 23/291* (2013.01); *H01L 23/3171* (2013.01);
(Continued)

(58) Field of Classification Search
CPC ............... H01L 23/3192; H01L 23/291; H01L 23/3171; H01L 29/7811; H01L 29/0696;
(Continued)

(56) References Cited

U.S. PATENT DOCUMENTS

| 4,988,403 A | * | 1/1991 | Matuo | ..................... H01L 24/05 |
| | | | | 257/E21.257 |
| 10,355,084 B1 | * | 7/2019 | Nishi | ..................... H01L 29/404 |

(Continued)

FOREIGN PATENT DOCUMENTS

| CN | 103985746 A | * | 8/2014 | ......... H01L 29/0615 |
| DE | 10 2019 215 905 A1 | | 4/2020 | |

(Continued)

OTHER PUBLICATIONS

JP H04212468 A Machine Translation (Year: 1992).*
(Continued)

*Primary Examiner* — Joshua Benitez Rosario
*Assistant Examiner* — David Chen
(74) *Attorney, Agent, or Firm* — Studebaker Brackett PLLC

(57) ABSTRACT

A semiconductor substrate includes: an active region; and a termination region surrounding the active region, and the semiconductor device includes: a first main electrode provided on the active region; a second main electrode provided on an opposite side of the first main electrode; an impurity region provided on an outermost periphery of the termination region; a first insulating film provided on an outer end edge part; a second insulating film provided on a region from an inner end edge part of the termination region to an end edge part of the active region; a first semi-insulating film covering a region from part of the impurity region which is not covered by the first insulating film to a partial upper side of the first insulating film; and a second semi-insulating film covering a region from the first semi-insulating film to a partial upper side of the first main electrode.

13 Claims, 15 Drawing Sheets

(51) Int. Cl.
  *H01L 23/31* (2006.01)
  *H10D 12/00* (2025.01)
  *H10D 62/10* (2025.01)

(52) U.S. Cl.
  CPC ......... *H10D 12/481* (2025.01); *H10D 62/106* (2025.01); *H10D 62/111* (2025.01); *H10D 64/111* (2025.01); *H10D 64/117* (2025.01)

(58) Field of Classification Search
  CPC ............. H01L 29/0638; H01L 29/7813; H01L 29/0634; H01L 29/7395; H01L 29/402; H01L 29/404; H01L 29/407; H01L 29/7397; H10D 12/481; H10D 62/106; H10D 62/111; H10D 64/111; H10D 64/117; H10D 12/038; H10D 12/491; H10D 64/115
  USPC .......... 257/139, 328, 339, 341, 488, 29.027; 438/135
  See application file for complete search history.

(56) References Cited

U.S. PATENT DOCUMENTS

| | | | | |
|---|---|---|---|---|
| 2001/0028100 | A1* | 10/2001 | Schmitz | H01L 23/3171 257/649 |
| 2005/0280086 | A1* | 12/2005 | Saito | H01L 29/0634 257/341 |
| 2010/0052047 | A1* | 3/2010 | Schmidt | H01L 29/7397 438/270 |
| 2011/0101453 | A1* | 5/2011 | Lin | H01L 23/3171 257/339 |
| 2012/0068310 | A1* | 3/2012 | Uemura | H10D 8/00 257/E29.198 |
| 2013/0037852 | A1* | 2/2013 | Tamaki | H01L 29/7811 257/493 |
| 2013/0181328 | A1* | 7/2013 | Cao | H01L 29/872 257/618 |
| 2015/0069536 | A1* | 3/2015 | Kim | H01L 29/7811 257/412 |
| 2016/0351384 | A1* | 12/2016 | Atkinson | H01L 21/02274 |
| 2017/0141290 | A1* | 5/2017 | Arakawa | H01L 41/1871 |
| 2017/0154955 | A1* | 6/2017 | Harada | H01L 29/0615 |
| 2017/0317068 | A1* | 11/2017 | Kaneda | H01L 21/761 |
| 2020/0127082 | A1 | 4/2020 | Chen et al. | |
| 2020/0365719 | A1* | 11/2020 | Nishimura | H01L 29/0634 |
| 2021/0083044 | A1* | 3/2021 | Yoshikawa | H01L 29/16 |

FOREIGN PATENT DOCUMENTS

| | | | | |
|---|---|---|---|---|
| GB | 2186116 | A * | 8/1987 | H01L 27/1112 |
| JP | 04212468 | A * | 8/1992 | H01L 29/402 |
| JP | H06-232409 | A | 8/1994 | |
| JP | 2019-149477 | A | 9/2019 | |

OTHER PUBLICATIONS

Azo Materials, Silica—Silicon Dioxide (SiO2).*
Azo Materials, Silicon Nitride (Si3N4) Properties and Applications.*
Azo Materials, Silicone Rubber.*
S. Honda, et al., "High Voltage Device Edge Termination for Wide Temperature Range plus Humidity with Surface Charge Control (SCC) Technology", ISPSD2016, pp. 291-294, Jun. 12-16, 2016, Prague, Czech Republic.
C, Papadopoulos, et al., "The influence of humidity on the high voltage blocking reliability of power IGBT modules and means of protection", Microelectronics Reliability, 88-90 (2018), pp. 470-475, 2018.
An Office Action; "Notice of Reasons for Refusal," mailed by the Japanese Patent Office on Oct. 18, 2022, which corresponds to Japanese Patent Application No. 2019-194002 and is related to U.S. Appl. No. 16/913,330; with English language translation.
An Office Action; "Notice of Reasons for Refusal," mailed by the Japanese Patent Office on Mar. 14, 2023, which corresponds to Japanese Patent Application No. 2019-194002 and is related to U.S. Appl. No. 16/913,330; with English language translation.
An Office Action mailed by China National Intellectual Property Administration on Jan. 10, 2024, which corresponds to Chinese Patent Application No. 202011123282.6 and is related to U.S. Appl. No. 16/913,330; with English language translation.
An Office Action issued by the German Patent and Trademark Office on Mar. 19, 2025, which corresponds to German Patent Application No. 102020123254.3 and is related to U.S. Appl. No. 16/913,330; with English language translation.
J. W. Osenbach et al., "Electrical, physical, and chemical characteristics of plasma-assisted chemical-vapor deposited semi-insulating a-SiN:H and their use as a resistive field shield for high voltage integrated circuits", Journal of Applied Physics, vol. 67, No. 11, pp. 6830-6843, Jun. 1, 1990.

* cited by examiner

SEMICONDUCTOR DEVICE INCLUDING FIRST AND SECOND SEMI-INSULATING LAYERS

BACKGROUND OF THE INVENTION

Field of the Invention

The present invention relates to a semiconductor device, and particularly to a semiconductor device including a bipolar transistor with an insulating gate.

Description of the Background Art

A power module includes a power device, an insulating substrate, a resin case, and a sealing member, for example. The power device is incorporated into a power module and used for various applications. The power module is used in a tough environment, for example, a high moisture environment in some cases, thus long-term reliability of the power module is required.

For example, in the high-moisture environment, a fluid enters from a gap of a resin case, gradually enters a sealing member from a surface and end surface of the sealing member, and then reaches a surface of a power device as time passes. "The influence of humidity on the high voltage blocking reliability of power IGBT modules and means of protection" (C, Papadopoulos, et al. Microelectronics Reliability, 88-90 (2018), 470-475.) discloses that a fluid or movable ions in a fluid resolved by high electrical field in a surface of an end portion of a power device corrode an aluminum thin film, and causes a physical breaking or an electrical breaking of the device.

"High voltage device edge termination for wide temperature range plus humidity with surface charge control (SCC) technology", ISPSD2016, pp. 291-294, 2016 by S. Honda, et al. discloses in FIG. 1(c) that surface-charge-control (SCC) is applied to a configuration in which a linearly narrowed field limiting ring (LNFLR) is provided as a termination structure of a termination region provided on an outer periphery of an active region in which a unit cell of a transistor is formed, thereby increasing reliability of the power device. FIG. 1(c) in the above non-patent document by S. Honda is referred to as a conventional structure hereinafter.

In the LNFLR to which the SCC is applied in the non-patent document, the termination region is covered with a semi-insulating film in place of the insulating film, a silicon oxide film covers a high concentration N-type impurity region provided on an upper layer part of a silicon substrate on an outermost periphery of the termination region and the silicon substrate around the N-type impurity region, an aluminum electrode connected to the N-type impurity region extends on the silicon oxide film, and the semi-insulating film covers the aluminum electrode and the silicon oxide film.

The semi-insulating film functions as a carrier path, and a carrier generated under a condition where the power device is electrically biased flows on the semi-insulating film and is excluded, thus is not stored in the termination region, and the reliability of the power device increases.

However, the aluminum electrode in the termination region is located close to an inner surface of the resin case, thus is easily influenced by the fluid entering from the gap of the resin case, and there is room for improvement in moisture resistance.

SUMMARY

A semiconductor device with increased moisture resistance is provided.

A semiconductor device according to the present invention is a semiconductor device in which a main current flows in a thickness direction of a semiconductor substrate, wherein the semiconductor substrate includes: an active region in which the main current flows; and a termination region surrounding the active region on an outer side of the active region, and the semiconductor device includes: a first main electrode provided on the active region; a second main electrode provided on an opposite side of the first main electrode of the semiconductor substrate; an impurity region provided on an upper layer part of the semiconductor substrate located on an outermost periphery of the termination region; a first insulating film provided on a region from an inner end edge part of the impurity region to a partial upper side of the semiconductor substrate in an outer end edge part of the terminal region; a second insulating film provided on a region from an inner end edge part of the termination region to an end edge part of the active region; a first semi-insulating film covering a region from part of the impurity region which is not covered by the first insulating film to at least a partial upper side of the first insulating film; and a second semi-insulating film covering a region from the first semi-insulating film to a partial upper side of the first main electrode.

According to the semiconductor device described above, the semiconductor device with increased moisture resistance can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Figure 1:
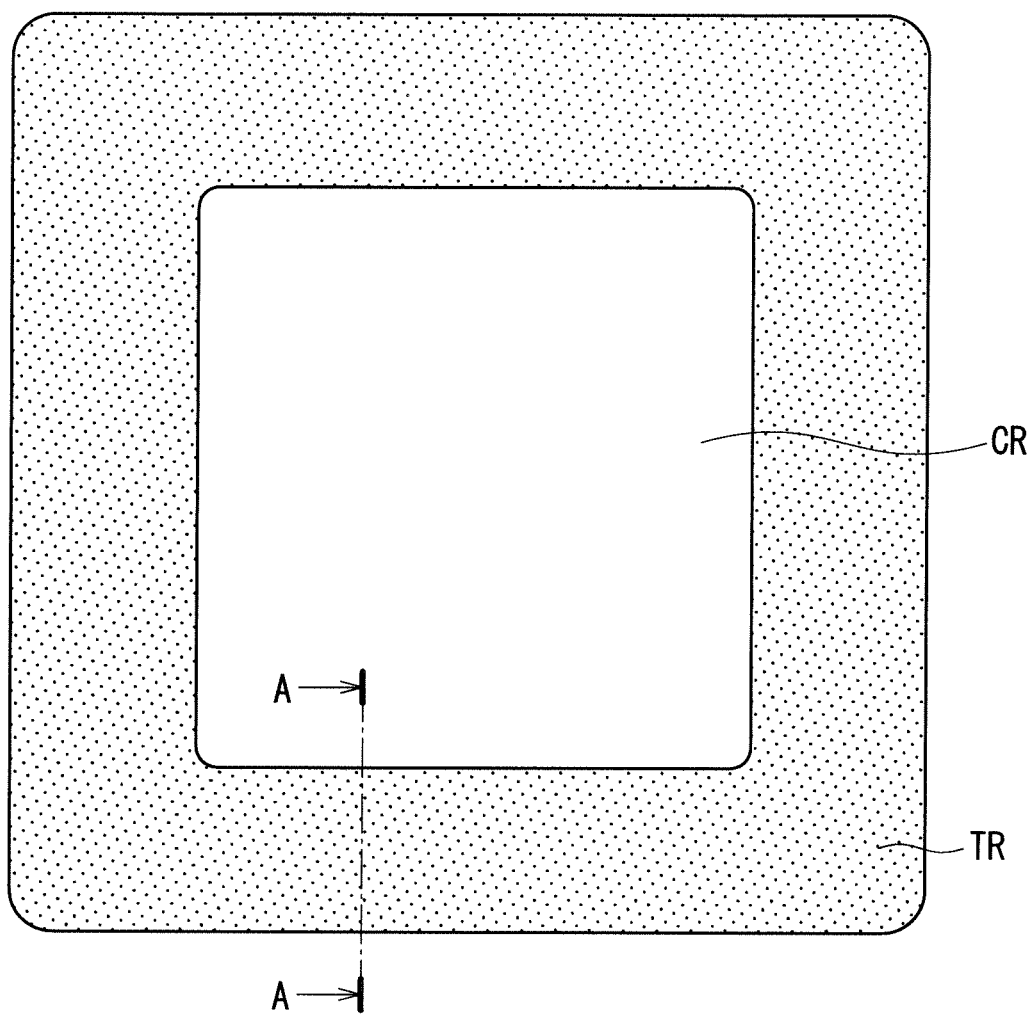
FIG. 1 is a plan view schematically illustrating an upper surface configuration of a semiconductor device according to an embodiment 1 of the present invention.

In the description hereinafter, a "cell region" is a region where a unit cell which is a minimum unit structure of a transistor is formed, and is also an "active region" where a main current flows in a semiconductor device in an on state. An "outer side" indicates a direction toward an outer periphery of a semiconductor device, and an "inner side" indicates a direction opposite to the "outer side" hereinafter. In the description hereinafter, with regard to a conductive type of impurity, an N type is generally defined as a "first conductive type" and a P type which is a conductive type opposite to the N type is generally defined as a "second conductive type", however, a reverse definition is also applicable.

The drawings are schematically illustrated, thus a mutual relationship of sizes and positions of configurations illustrated in the different drawing is not necessarily accurately illustrated, but can be appropriately changed. In the description hereinafter, the same reference numerals will be assigned to the similar constituent elements in the drawings, and the constituent elements having the same reference numeral have the same name and function. Accordingly, the detailed description on them may be omitted in some cases. The terms of "on A" and "cover A" in the present specification do not avoid a configuration that there is an inclusion between constituent elements. For example, the description of "B provided on A" or "A covers B" may mean both configurations that the other constituent element C is and is not provided between A and B. In the following description, even when terms indicating a specific position and direction such as "upper", "lower", "side", "bottom", "front" or "rear" are stated, the terms are used to facilitate understanding of embodiments for convenience, and therefore, irrelevant to directions in practical implementation.

Embodiment 1

FIG. 1 is a plan view schematically illustrating an upper surface configuration of an insulated gate bipolar transistor (IGBT) 100 according to an embodiment 1 of the present invention. As illustrated in FIG. 1, the IGBT 100 is provided on a semiconductor substrate having a quadrilateral shape in a plan view and broadly separated into a cell region CR (active region) in a central part and a termination region TR around the cell region CR.

Figure 2:
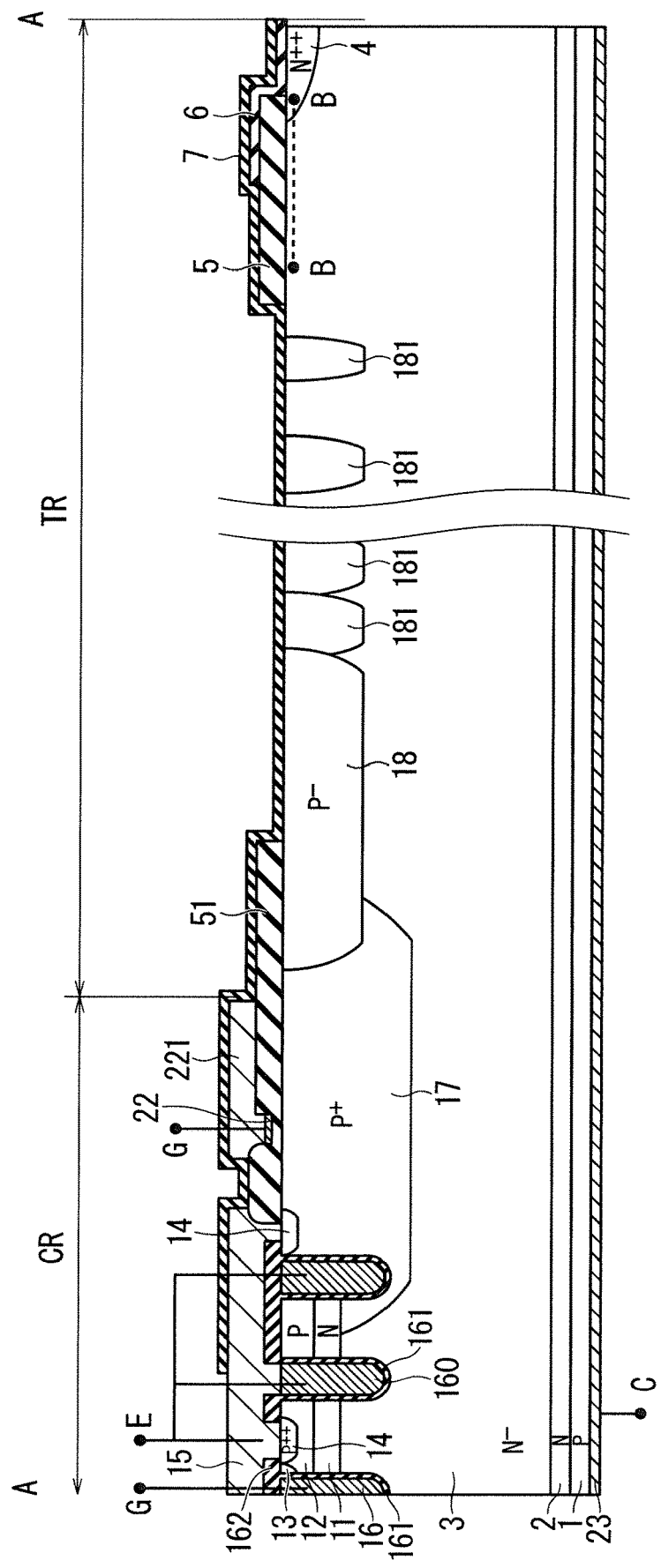
FIG. 2 is a cross-sectional view schematically illustrating a configuration of the semiconductor device according to the embodiment 1 of the present invention.

FIG. 2 is a cross-sectional view along an A-A line in an arrow direction. As illustrated in FIG. 2, the IGBT 100 includes an impurity layer 11 containing an N-type impurity with a concentration of $1\times10^{15}$ to $1\times10^{16}/cm^3$ (N) selectively provided on an upper layer part of a semiconductor substrate 3 containing an N-type impurity with a concentration of $1\times10^{12}$ to $1\times10^{13}/cm^3$ (N−), a well layer 12 containing a P-type impurity with a concentration of $1\times10^{16}$ to $1\times10^{18}/cm^3$ (P) provided on an upper layer part of the impurity layer 11, and a trench gate electrode 16 having contact with a region from an uppermost surface of the semiconductor substrate 3 to a side surface of each of the well layer 12 and the impurity layer 11 and reaching an inner portion of the semiconductor substrate 3. The IGBT 100 further includes a gate insulating film 161 provided on a side surface of the trench gate electrode 16, an emitter region 13 selectively provided on an upper layer part of the well layer 12, partially having contact with the gate insulating film 161, and containing an N-type impurity with a concentration of $1\times10^{15}$ to $1\times10^{16}/cm^3$ (N), a contact region 14 containing a P-type impurity with a concentration (P++) of $1\times10^{18}$ to $1\times10^{19}/cm^3$ selectively provided on an upper layer part of the well layer 12, and a dummy trench gate electrode 160 provided on an outer side of the trench gate electrode 16.

The dummy trench gate electrode 160 includes the gate insulating film 161 on a side surface thereof in the manner similar to the trench gate electrode 16, and emitter potential is supplied to the dummy trench gate electrode 160 in the manner similar to the contact region 14.

In the two dummy trench gate electrodes 160, the dummy trench gate electrode 160 located on an inner side is directly connected to an emitter electrode 15 (first main electrode), and the dummy trench gate electrode 160 located on an outer side is connected to the emitter electrode 15 via a contact hole (not shown) provided in an extension direction of the trench.

An interlayer insulating film 162 covers the trench gate electrode 16, and the emitter electrode 15 covers the interlayer insulating film 162.

The dummy trench gate electrode 160 is provided for purpose of retaining withstand voltage and preventing oscillation of the IGBT 100, however, the dummy trench gate electrode 160 is not necessary, thus a configuration of not providing the dummy trench gate electrode 160 is also applicable.

A guard ring 17 containing a P-type impurity with a concentration (P+) of $1\times10^{17}$ to $1\times10^{18}/cm^3$ is provided on the upper layer part of the semiconductor substrate 3 to range from an outer edge of the cell region CR to an inner edge of the termination region TR.

The guard ring 17 is provided for purpose of retaining withstand voltage of the IGBT 100, and suppresses an occurrence of electrical field concentration on a bottom part of the trench gate electrode 16 on an outermost periphery of the cell region CR.

The contact region 14 is selectively provided also on an upper layer part of the guard ring 17, the contact region 14 is connected to the emitter electrode 15, and emitter potential is supplied to the guard ring 17.

A reduced surface field (RESURF) layer 18 containing a P-type impurity with a concentration of $1\times10^{15}$ to $1\times10^{16}/cm^3$ (P−) is provided to be partially and internally included in an outer edge of the guard ring 17. The RESURF layer 18 is provided for purpose of retaining withstand voltage, and reduces an electrical field on the outer edge of the guard ring 17.

A plurality of RESURF layers 181 each having a length in a horizontal direction smaller than the RESURF layer 18 are provided on an outer side of the RESURF layer 18 so that an arrangement interval thereof increases toward outside. A concentration of a P-type impurity of the RESURF layer 181 is substantially equal to that of the RESURF layer 18. The RESURF layer 181 is also provided for purpose of retaining withstand voltage, and voltage is shared by PN junctions between each RESURF layer and the semiconductor substrate 3 to retain the withstand voltage. Each of the RESURF layers 18 and 181 is also referred to as a junction termination extension (JTE) layer in some cases.

An impurity region 4 containing an N-type impurity with a high concentration (N++) is provided on the upper layer part of the semiconductor substrate 3 on the outermost periphery of the termination region TR. The impurity region 4 is provided as a channel stopper, thereby suppressing a depletion layer reaching a chip end and suppressing reduction in a withstand voltage retaining capacity.

A buffer layer 2 containing an N-type impurity with a concentration of $1\times10^{15}$ to $1\times10^{16}/cm^3$ (N) is provided on a lower layer part of the semiconductor substrate 3, a collector layer 1 containing a P-type impurity with a concentration of $1\times10^{16}$ to $1\times10^{18}/cm^3$ (P) is provided under the buffer layer 2, and a collector electrode 23 (second main electrode) is connected to the collector layer 1.

A silicon oxide film 51 (second insulating film) is provided on a region from the guard ring 17 to an end edge part on an inner side of the RESURF layer 18. A gate wiring 22 is provided on the silicon oxide film 51. The gate wiring 22 is provided along the cell region CR in the manner similar to the guard ring 17, and the gate wiring 22 is connected to a gate wiring electrode 221 provided on the silicon oxide film 51. The gate wiring electrode 221 is an aluminum electrode, and is electrically connected to an external unit via a wiring not shown. The silicon oxide films 5 and 51 can be made up of a thermo-oxidative silicon oxide film (thermal oxide film), a tetraethylorthosilicate (TEOS) oxide film containing boron (B) and phosphorus (P) (BPTEOS film), or a multilayer film of thermal oxide film and BPTEOS film.

The silicon oxide film 5 (first insulating film) is provided on a range from an inner end edge part of the impurity region 4 to the semiconductor substrate 3 near the impurity region 4. The silicon oxide film 5 functions as a field plate, and stops an extension of a depletion layer on the surface of the semiconductor substrate 3.

A semi-insulating film 6 (first semi-insulating film) is provided to cover a region from an outer end edge part of the silicon oxide film 5 to the impurity region 4, and a semi-insulating film 7 (second semi-insulating film) is provided to cover the whole termination region TR including the upper side of the semi-insulating film 6 and an end edge part of the cell region CR.

The IGBT 100 applies such a configuration, thus the withstand voltage and moisture resistance are increased. An evaluation of moisture resistance is described hereinafter.

Embodiment 2

Figure 3:
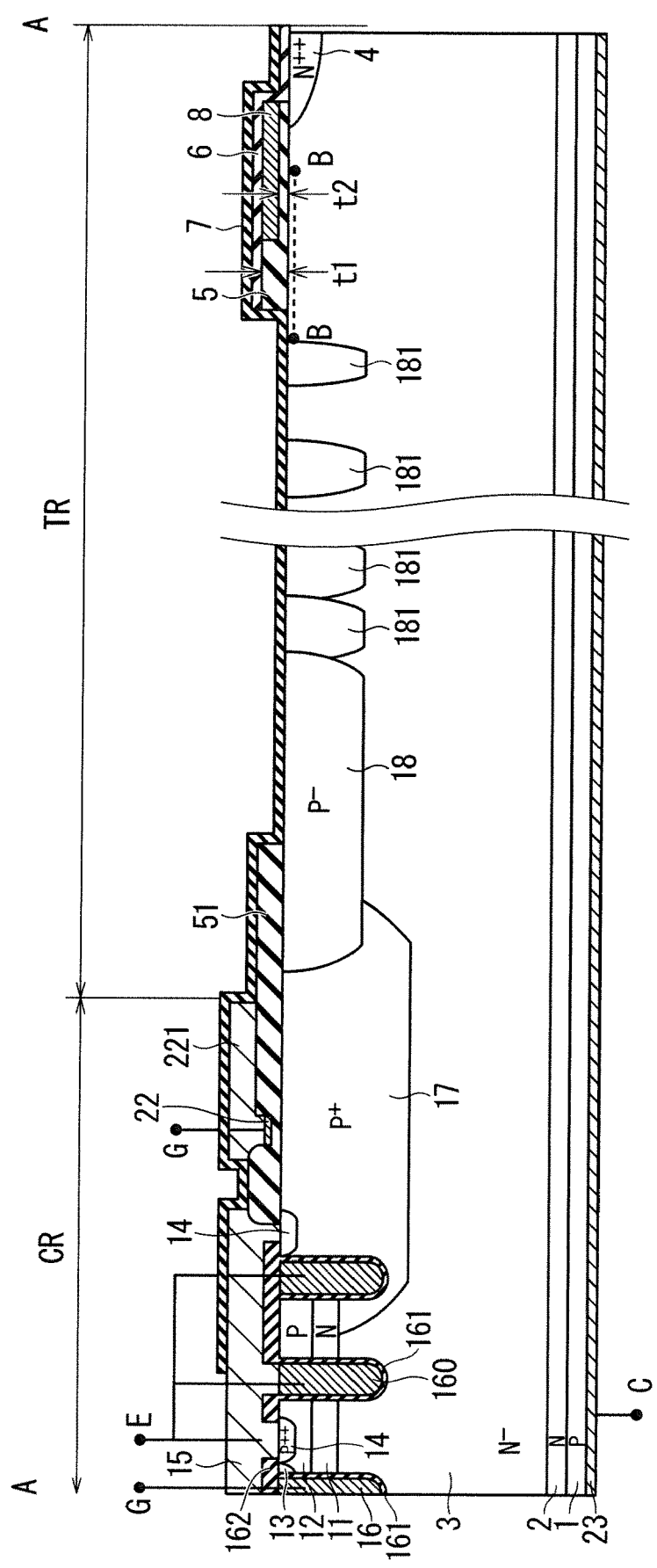
FIG. 3 is a cross-sectional view illustrating a configuration of a semiconductor device according to an embodiment 2 of the present invention.

FIG. 3 is a cross-sectional view of an IGBT 200 according to an embodiment 2 of the present invention, and is a cross-sectional view corresponding to the cross-sectional view of the IGBT 100 in the arrow direction illustrated in FIG. 2. In FIG. 3, the same reference numerals are be assigned to the same constituent elements as that of the IGBT 100 described using FIG. 2, and the repetitive description thereof is omitted.

As illustrated in FIG. 3, in the IGBT 200, the outer end edge part of the silicon oxide film 5 provided on a region from the inner end edge part of the impurity region 4 to the semiconductor substrate 3 near the impurity region 4 is formed to have a level difference, and a polysilicon film 8 having conductivity is provided to fill the level difference. The polysilicon film 8 is provided, thus an upper surface of the silicon oxide film 5 and an upper surface of the polysilicon film 8 have almost the same height, and form a flat surface. The semi-insulating film 6 is provided to cover a region from the flat surface to the impurity region 4, and the semi-insulating film 7 is provided to cover the whole termination region TR including the upper side of the semi-insulating film 6 and the end edge part of the cell region CR.

The IGBT 200 applies such a configuration, thus the withstand voltage and moisture resistance are increased. An evaluation of moisture resistance is described hereinafter.

Embodiment 3

Figure 4:
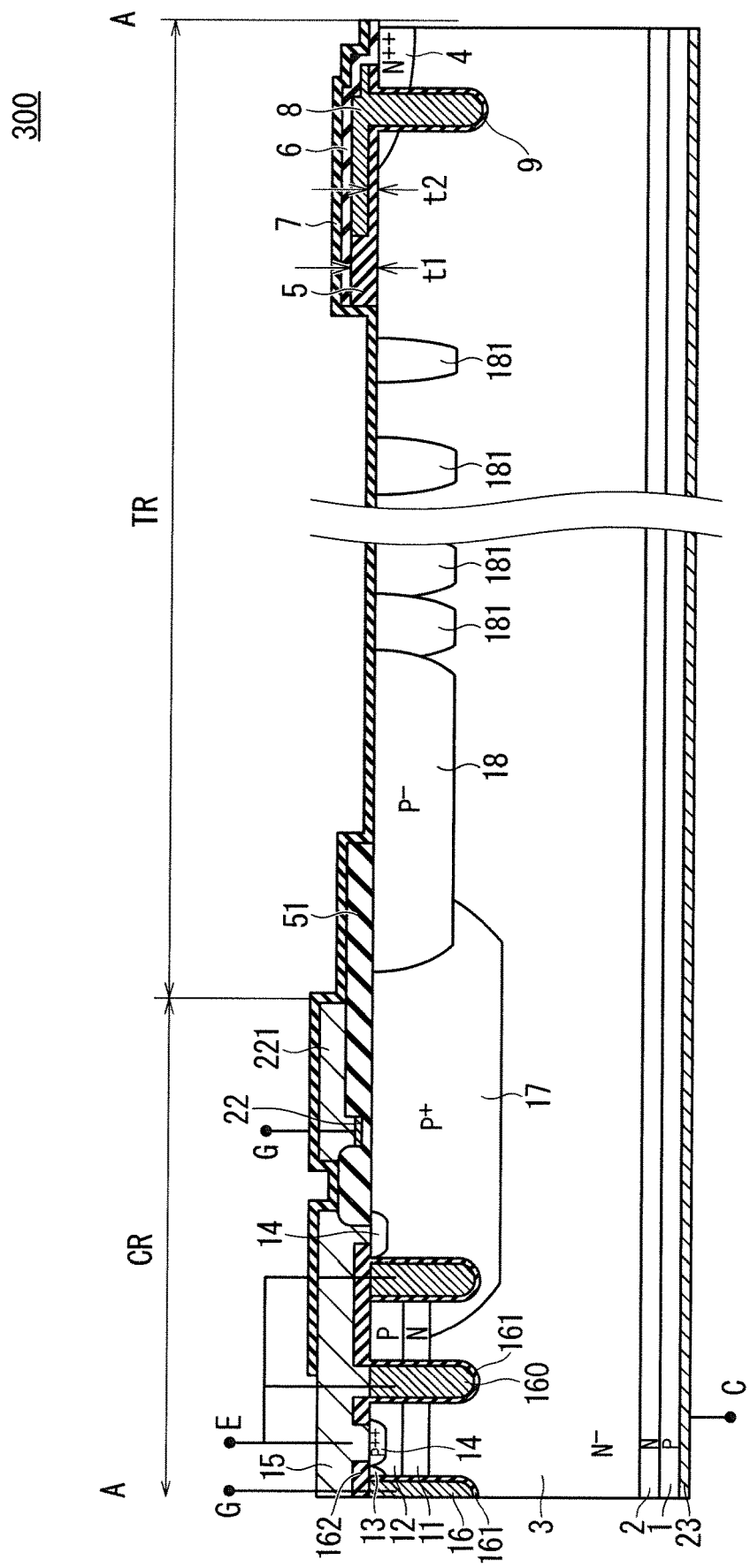
FIG. 4 is a cross-sectional view illustrating a configuration of a semiconductor device according to an embodiment 3 of the present invention.

FIG. 4 is a cross-sectional view of an IGBT 300 according to an embodiment 3 of the present invention, and is a cross-sectional view corresponding to the cross-sectional view of the IGBT 100 in the arrow direction illustrated in FIG. 2. In FIG. 4, the same reference numerals are be assigned to the same constituent elements as that of the IGBT 100 described using FIG. 2, and the repetitive description thereof is omitted.

As illustrated in FIG. 4, in the IGBT 300, the outer end edge part of the silicon oxide film 5 provided on the region from the inner end edge part of the impurity region 4 to the semiconductor substrate 3 near the impurity region 4 is formed to have the level difference, and is formed to cover an inner surface of a trench 9 passing through the impurity region 4 to reach the inner portion of the semiconductor substrate 3. Then, the polysilicon film 8 is provided to fill the level difference of the silicon oxide film 5 and embed the trench 9 whose inner surface is covered by the silicon oxide film 5. The polysilicon film 8 is provided, thus an upper surface of the silicon oxide film 5 and the upper surface of the polysilicon film 8 have almost the same height, and form the flat surface. The semi-insulating film 6 is provided to cover the region from the flat surface to the impurity region 4, and the semi-insulating film 7 is provided to cover the whole termination region TR including the upper side of the semi-insulating film 6 and the end edge part of the cell region CR.

The IGBT 300 applies such a configuration, thus the withstand voltage and moisture resistance are increased. An evaluation of moisture resistance is described hereinafter.

<Withstand Voltage and Moisture Resistance>

Figure 5:
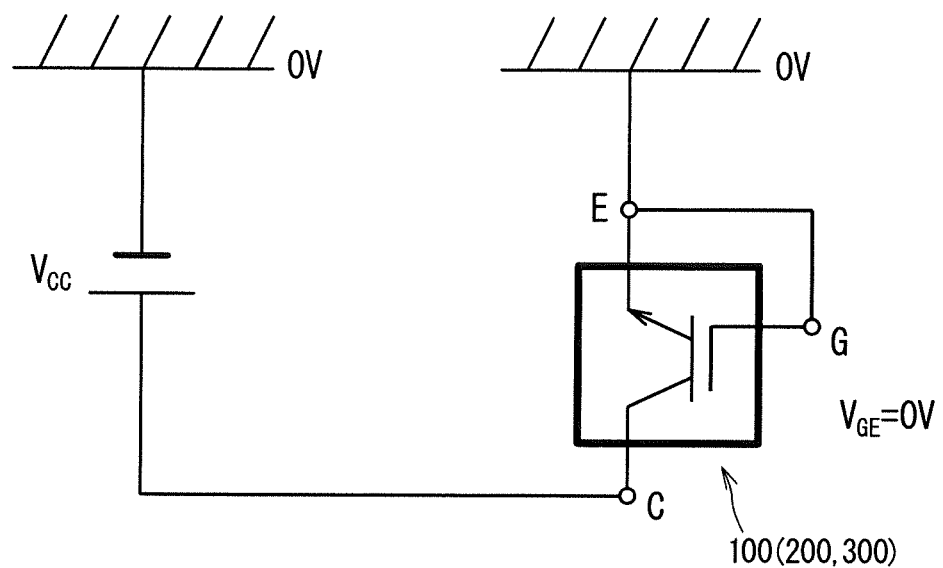
FIG. 5 is a drawing illustrating an equivalent circuit for a moisture resistance experiment.
Figure 6:
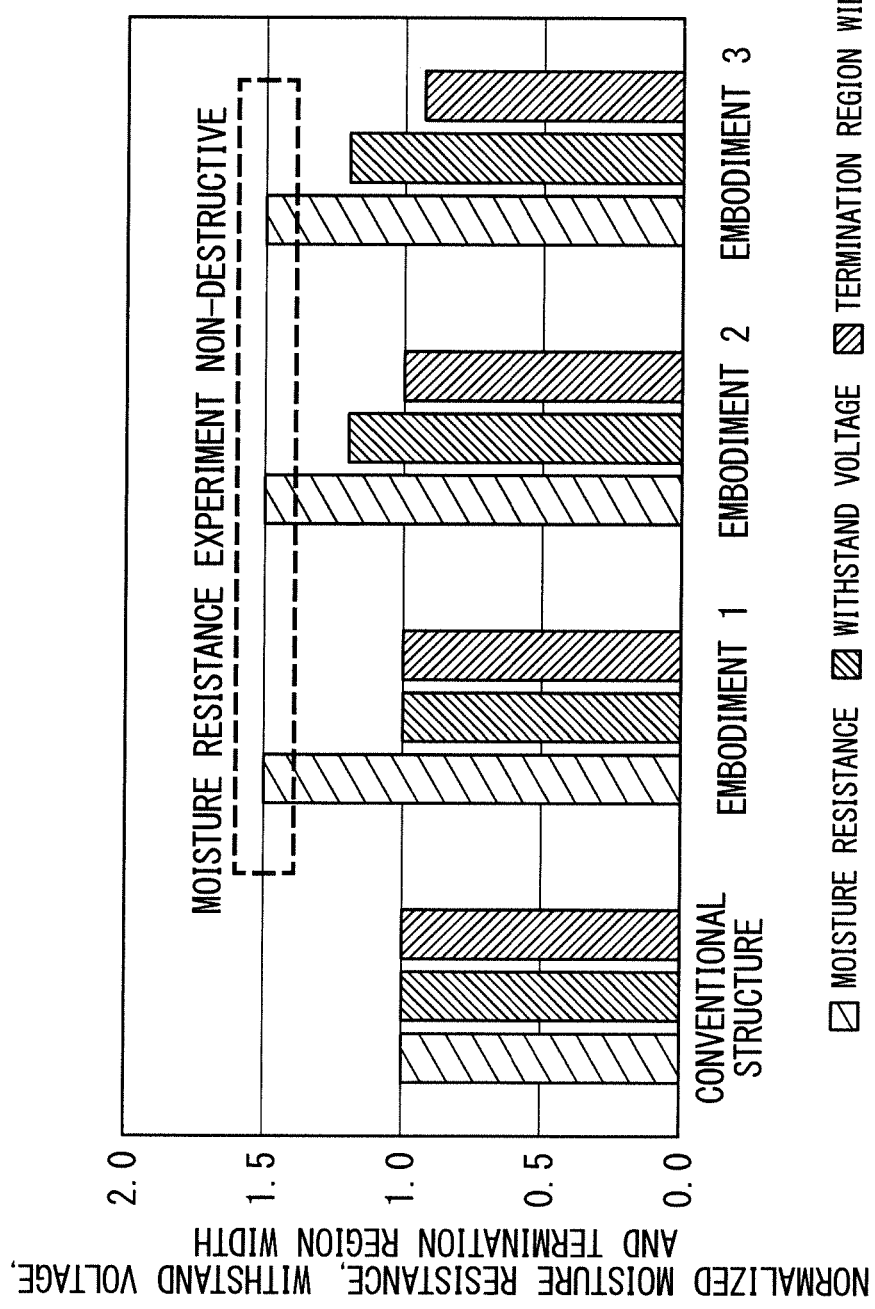
FIG. 6 is a drawing illustrating an experimental result of a moisture resistance experiment.

The withstand voltage and moisture resistance of the IGBT 100 are described hereinafter. FIG. 5 illustrates an equivalent circuit for a moisture resistance experiment on the IGBT 100. As illustrated in FIG. 5, in the moisture resistance experiment, a gate electrode G and an emitter electrode E of the IGBT 100 are short-circuited and connected to a ground (0V), thus a gate-emitter voltage $V_{GE}$ is set to 0V and the IGBT 100 is normally set to be in off state. A collector voltage $V_{CC}$ is applied from a DC current source to a collector electrode C. FIG. 6 illustrates an experimental result of performing a moisture resistance experiment while a power source voltage is set to be 85% of a rated voltage in a state where a temperature is 150 C.° and a relative humidity is 85%.

FIG. 6 illustrates, by a bar graph, a comparison result of withstand voltage (electrostatic withstand voltage), moisture resistance, and a width of termination region between the IGBTs 100 to 300 in the embodiments 1 to 3 described above and a conventional structure. FIG. 6 illustrates a result that the moisture resistance, the withstand voltage, and the width of termination region in the embodiments 1 to 3 are normalized while applying the moisture resistance, the withstand voltage, and the width of termination region of the conventional structure as a standard.

The evaluation of moisture resistance was performed in a state where the gate electrode G and the emitter electrode E were short-circuited as illustrated in FIG. 5 while the temperature was 150 C.° and the relative humidity was 85%, and a power source voltage set to be 85% of a rated voltage, for example, a power source voltage of 5525 V, in a case of a device whose rated voltage level is 6.5 kV, was applied.

That is to say, the power source voltage is continuously applied until a property fluctuation occurs in the device, until a breaking occurs in the device, or for a specified time. For example, it is evaluated that a sample in which a property fluctuation, an appearance deterioration, and a breaking do not occur even when the power source voltage is applied for 1000 hours in the above condition has a moisture resistance at least twice as excellent as a sample broken in 500 hours. In this manner, relative merits of the moisture resistance were evaluated by a length of time during which a constant performance was kept.

The withstand voltage was evaluated by a dynamic withstand voltage test on a general semiconductor device, and the width of the termination region was evaluated by comparing the width of the termination region of each of the IGBTs 100 to 300 in the embodiments 1 to 3 and the width of the termination region of the conventional structure.

As illustrated in FIG. 6, in an experiment result of moisture resistance, all the configurations in the embodiments 1 to 3 exceeded the conventional structure, and the breaking did not occur in any of the configurations in the embodiments 1 to 3 even when the experiment continued for a period of time 1.5 times as long as a length of time during which the conventional structure broke. It is considered that the aluminum electrode is provided in the termination region in the conventional structure, however, in the IGBTs 100 to 300 according to the embodiments 1 to 3, the semi-insulating film 6 is provided in place of the aluminum electrode, thus the aluminum electrode is not corroded by the moisture, and the moisture resistance increases.

The withstand voltage in the embodiment 2 is 1.2 times as large as the withstand voltage in the embodiment 1. The reason is that the polysilicon film 8 is provided on the outer end edge part of the silicon oxide film 5 in the termination region, and the polysilicon film 8 functions as a field plate.

That is to say, in the IGBT 200 as illustrated in FIG. 3, a thickness t2 (second thickness) of the silicon oxide film 5 between the polysilicon film 8 and the surface of the semiconductor substrate 3 is smaller than a thickness t1 (first thickness) of the silicon oxide film 5 between the semi-insulating film 6 and the surface of the semiconductor substrate 3, thus the polysilicon film 8 and the semi-insulating film 6 form a two-stage field plate structure.

The field plate structure herein indicates a multilayer structure of a conductive film, an insulating film, and a semiconductor layer, and the two-stage field plate structure indicates that each of two conductive films forms the field plate structure with a semiconductor layer via an insulating film.

The IGBT 200 includes two-layer film made up of the semi-insulating film 6 on the silicon oxide film 5 having the thickness t1 and the polysilicon film 8 and the semi-insulating film 6 on the silicon oxide film 5 having the thickness t2, and is considered to have the two-stage field plate structure with the semiconductor substrate 3.

In the case of IGBT 200, an N-type electron stored layer occurs at an interface between the semiconductor substrate 3 located immediately below the silicon oxide film 5 and the silicon oxide film 5 in the field plate structure in a withstand voltage mode. This electron stored layer becomes a quasi high concentration N⁻ layer, and stops the extension of the depletion layer on the surface of the semiconductor substrate 3 which is the N⁻ drift layer, however, an electrical field concentration occurs immediately below the end edge part of the field plate.

However, in the two-stage field plate structure, a length of each field plate and a thickness of the insulating film (silicon oxide film 5) below the field plate are appropriately set, thus the electrical field concentration occurring immediately below the field plate can be dispersed. The local electrical field concentration is suppressed, thus the withstand voltage can be increased. As the number of stages of the field plate increases, the electrical field concentration can be finely dispersed, and the withstand voltage is increased.

In this manner, the IGBT 200 in the embodiment 2 having the two-stage field plate structure has the withstand voltage larger than the IGBT 100 in the embodiment 1 having the single-stage field plate structure. As illustrated in FIG. 6, the IGBT 300 in the embodiment 3 also has the two-stage field plate structure, thus has the withstand voltage larger than the IGBT 100.

Furthermore, the IGBT 300 in the embodiment 3 has the width of the termination region smaller than the IGBTs 100 and 200 in the embodiments 1 and 2. The reason is that as illustrated in FIG. 4, the IGBT 300 includes the trench 9 passing through the impurity region 4 to reach the inner portion of the semiconductor substrate 3 on the outer periphery of the termination region, and the polysilicon film 8 is embedded into the trench 9 via the silicon oxide film 5, thus the length of the field plate, a creeping distance of the polysilicon film 8 herein, increases. Thus, the withstand voltage is kept constant, and the width of the termination region can be shrunk. When this structure is adopted, the withstand voltage can also be increased even in a case where the width of the termination region is the same as that of each of the other embodiments.

Figure 7:
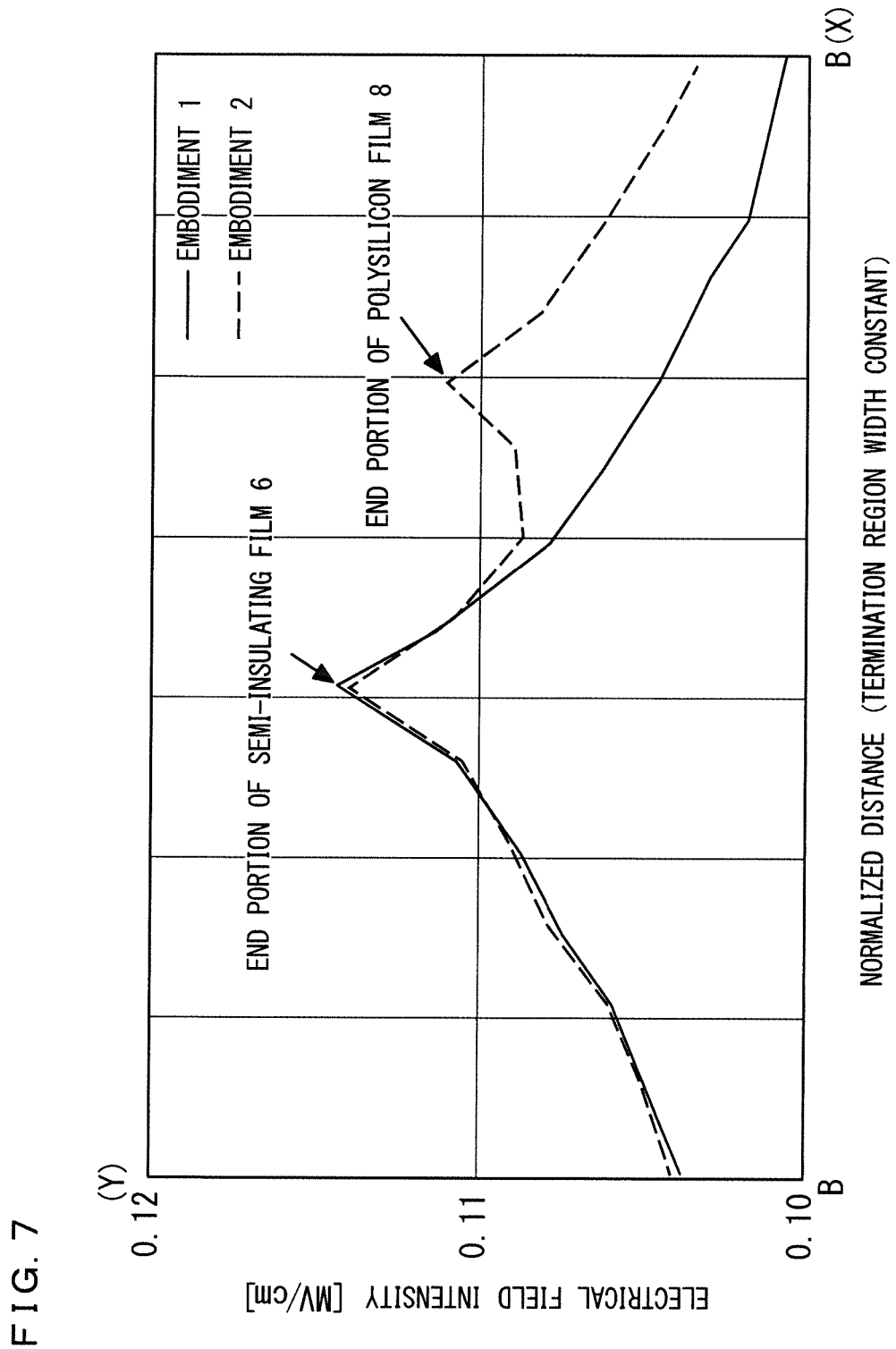
FIG. 7 is a drawing illustrating a comparison result of a surface electrical field distribution in the semiconductor device according to the embodiments 1 and 2 of the present invention.

FIG. 7 illustrates a comparison result of a surface electrical field distribution in a region of a B-B line shown in FIG. 2 and FIG. 3 in the IGBTs 100 and 200 in the embodiments 1 and 2, respectively. In FIG. 7, a vertical axis (Y axis) indicates an electrical field intensity (MV/cm) and a lateral axis (X axis) indicates a normalized distance, and the width of the termination region is set constant.

In FIG. 7, the surface electrical field distribution in the embodiment 1 is indicated by a solid line, and the surface electrical field distribution in the embodiment 2 is indicated by a broken line. The electrical field intensity takes a peak value in an end portion of the semi-insulating film 6 in the surface electrical field distribution in the embodiment 1, and the electrical field intensity takes a peak value in an end portion of the polysilicon film 8 in the surface electrical field distribution in the embodiment 2.

Voltage is an integral of an electrical field and a distance, and in FIG. 7, an area of a region defined by an electrical field distribution and the X axis indicates withstand voltage. FIG. 7 illustrates a local electrical field distribution in part where the field plate structure is provided, and shows that the IGBT 200 in the embodiment 2 has the area of the electrical field distribution and withstand voltage both larger than the IGBT 100 in the embodiment 1, <Material of Semi-Insulating Film>

Materials of the semi-insulating film 6 and semi-insulating film 7 are described next. The semi-insulating film 6 is formed of a material having resistance to be used as the field plate. As an example thereof, the semi-insulating film 6 is formed as a resistive thin film made of silicon nitride having a composition with excess Si compared with $Si_3N_4$. Accordingly, the semi-insulating film 6 can be used as the field plate, thus the local electrical field concentration is suppressed in the termination region, and the withstand voltage is increased.

When a ratio between Si and N (Si:N) is too small, a hopping conduction hardly occurs in the semi-insulating film 6, so that the semi-insulating film 6 does not function as the field plate having conductivity. There is no upper limit of Si:N in making the semi-insulating film 6 function as the field plate, however, there is an upper limit of Si:N in accordance with a limitation of a film-forming temperature and a chemical reaction process in a film formation, thus Si:N≤1:2.5 is substantially established.

Figure 8:
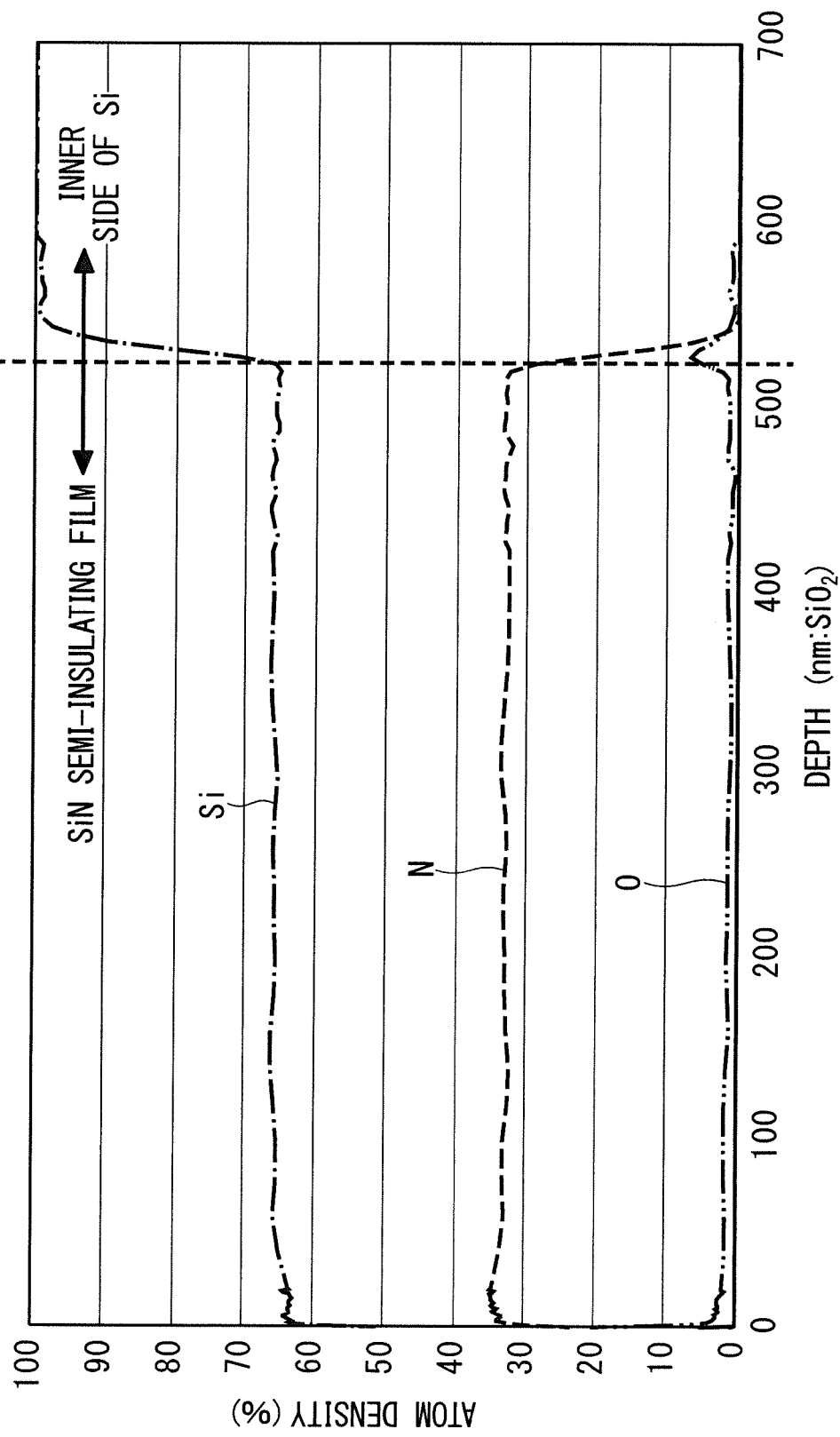
FIG. 8 is a drawing illustrating a depth profile of a silicon nitride film.

FIG. 8 illustrates an example of a depth profile of a semi-insulating film. A lateral axis indicates a depth (nm), and a vertical axis indicates an atom density ratio (%) in FIG. 8. FIG. 8 illustrates a depth profile of a silicon nitride film formed on silicon, and Si:N is substantially 2:1.

The semi-insulating film 6 has a semi-insulation property, thus is influenced by an external load and movable ions inside a sealing member of a power module more easily than a metal material such as the aluminum electrode. The semi-insulating film 6 is covered by the semi-insulating film 7 to block the influence of the external load. The influence of the external load can be suppressed by making the semi-insulating film 7 have contact with the emitter electrode 15 on a cell region side, using hopping conduction property of the semi-insulating film.

That is to say, the semi-insulating film 6 is in a floating state, and is easily influenced by the external load, however, the semi-insulating film 7 has contact with the emitter electrode 15 (ground) on the cell region side, and has the same potential on a termination region side as on a high voltage side via the semi-insulating film 6, thus an inner potential distribution of the semi-insulating film 7 is almost fixed, and is hardly influenced by the external load. A specific resistance of the semi-insulating films 6 and 7 at a voltage 20 V and a temperature 25° C. is $10^{13}$ to $10^{16}$ Ωcm.

The hopping conduction is a conduction mechanism by a carrier excitation in a band gap of a material. When there is the hopping conduction, a local load temporarily induced by an external influence is not continuously fixed in the same position, but gradually moves to a ground or the high potential side and disappears. When the load is continuously fixed in the same position, the load influences the electrical field distribution inside the semiconductor substrate by a dielectric phenomenon and reduces the withstand voltage, however, the semi-insulating film has the hopping conduction property, thus can suppress the reduction in the withstand voltage.

The same effect is obtained regardless of whether the semi-insulating film 6 and the semi-insulating film 7 are made of a material of the same composition or a material of a different composition as long as they have the resistance. Even when the semi-insulating film 6 the semi-insulating film 7 are made of a material of the same composition, a level difference with the semi-insulating film 7 is formed on an outer peripheral end portion of the semi-insulating film 6, thus the semi-insulating film 6 and the semi-insulating film 7 can be distinguished in a cross-sectional observation. A film thickness of part of a two-layer structure made up of the semi-insulating film 6 and the semi-insulating film 7 is larger than that of part of only the semi-insulating film 7, thus the semi-insulating film 6 and the semi-insulating film 7 can be distinguished in a cross-sectional observation.

Modification Example

Figure 9:
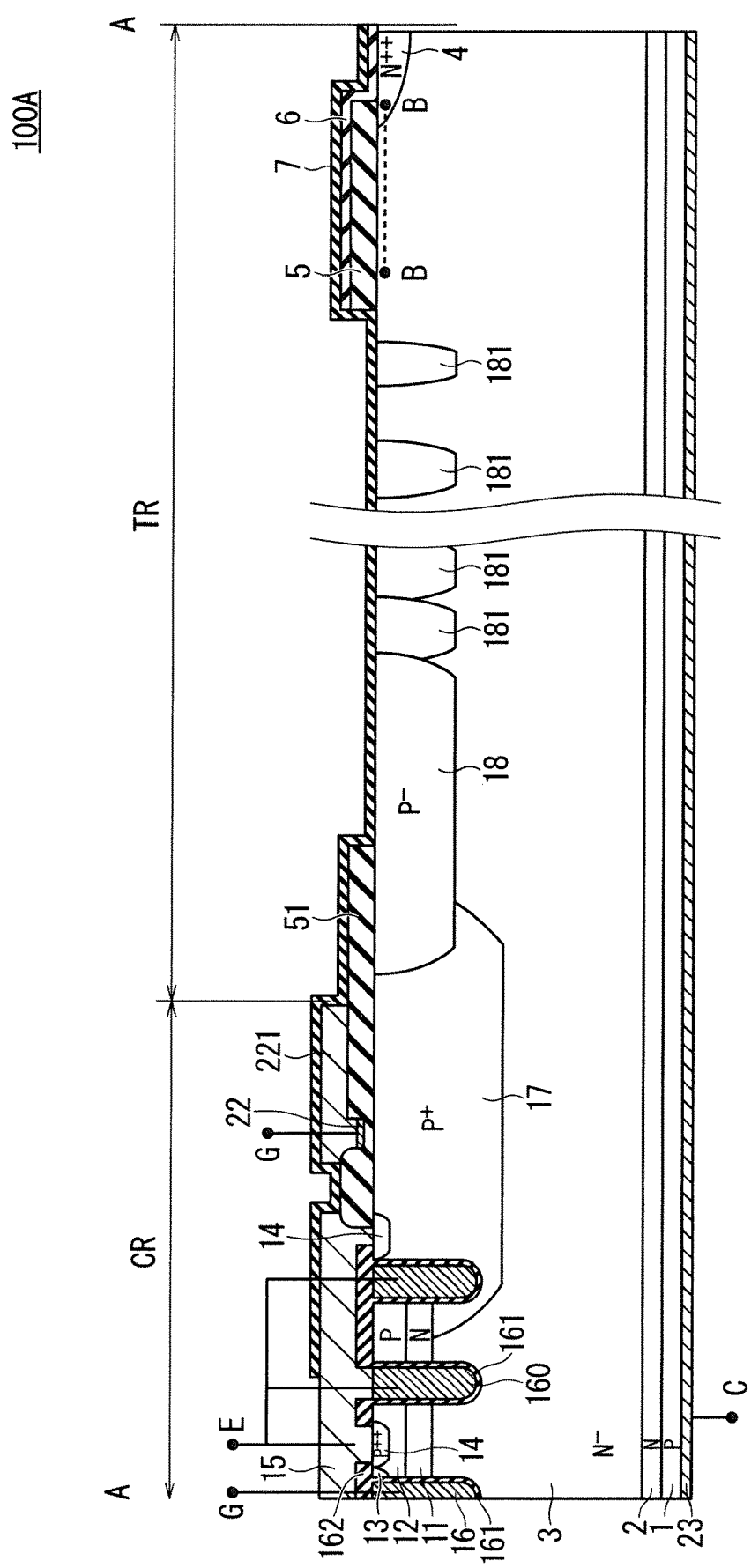
FIG. 9 is a cross-sectional view illustrating a configuration of a semiconductor device according to a modification example of the embodiment 1 of the present invention.

In the IGBT 100 according to the embodiment 1 illustrated in FIG. 1, the semi-insulating film 6 is provided to cover the region from the outer end edge part of the silicon oxide film 5 in the termination region TR to the impurity region 4, however, the semi-insulating film 6 may also be provided to cover the whole upper side of the silicon oxide film 5 in the termination region as is a case for an IGBT 100A illustrated in FIG. 9. The effect by adopting this structure is the same as that in the IGBT 100.

Figure 10:
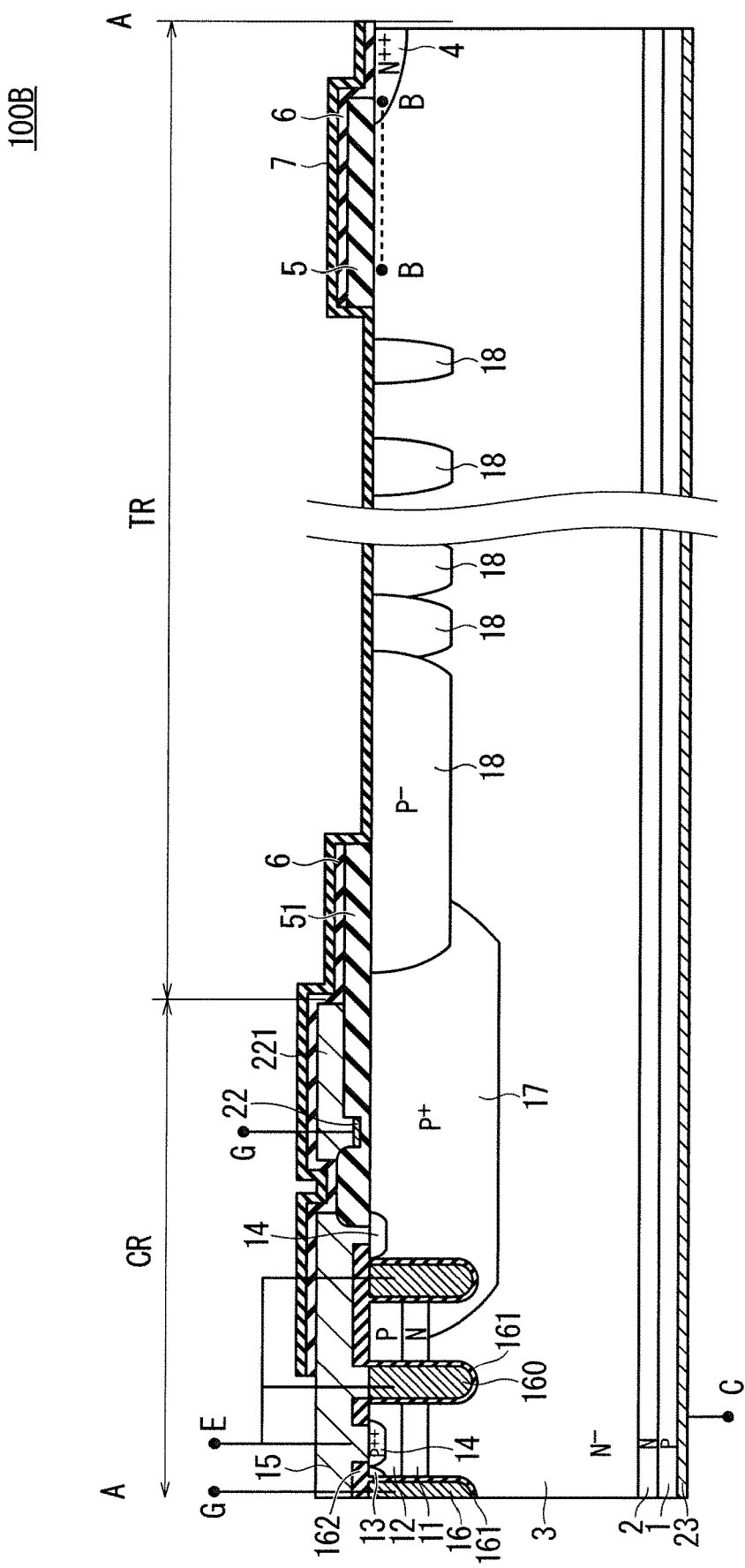
FIG. 10 is a cross-sectional view illustrating a configuration of a semiconductor device according to a modification example of the embodiment 1 of the present invention.

In the IGBT 100 according to the embodiment 1 illustrated in FIG. 1, the semi-insulating film 6 is provided to cover the region from the outer end edge part of the silicon oxide film 5 in the termination region TR to the impurity region 4, however, it is also applicable that, as is a case for an IGBT 100B illustrated in FIG. 10, the semi-insulating film 6 covers the whole upper side of the silicon oxide film 5 in the termination region, and covers the silicon oxide film 51 provided on the region from the guard ring 17 to the end edge part on the inner side of the RESURF layer 18 and the end edge part of the cell region CR. The effect by adopting this structure is the same as that in the IGBT 100. In this case, the semi-insulating film 7 is electrically connected to the emitter electrode 15 via the semi-insulating film 6.

As described above, it is also applicable to apply the configuration of providing the semi-insulating film 6 to cover the region from the silicon oxide film 51, which is provided on the region from the guard ring 17 to the end edge part on the inner side of the RESURF layer 18, to the end edge part of the cell region CR to the IGBTs 200 and 300 in the embodiments 2 and 3. The effect by adopting this structure is the same as that in the IGBT 200 and 300.

In all the embodiments 1 to 3, the effect of blocking the moisture is enhanced by further covering the semi-insulating film 7 by the other semi-insulating film, an insulating film, and a polyimide resin, for example.

The silicon oxide film 5 may be sequentially provided on the whole termination region or intermittently provided thereon. Even in a case of adopting these configurations, the effect similar to that in the IGBTs 100 to 300 in the embodiments 1 to 3 is achieved.

<Method of Forming Semi-Insulating Film>

A method of manufacturing the semi-insulating film 6 and semi-insulating film 7 are described next using FIG. 11 to FIG. 19. Each of FIG. 11 to FIG. 19 illustrates a cross section centering on an outer peripheral part of the termination region TR, and the illustration of an impurity region and impurity layer other than the impurity region 4 is omitted.

Firstly, in a process illustrated in FIG. 11, the silicon oxide film 5 is formed on the semiconductor substrate 3, and subsequently, a resist mask RM1 for patterning the silicon oxide film 5 is formed by photolithography.

Next, in a process illustrated in FIG. 12, the silicon oxide film 5 is patterned by etching using the resist mask RM1, and subsequently, the resist mask RM1 is removed.

Figure 13:
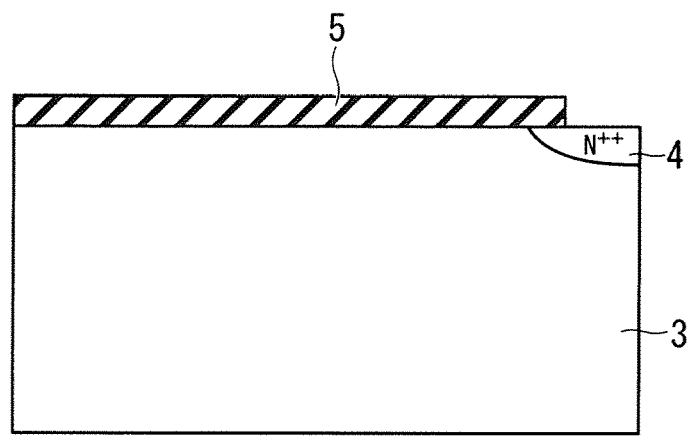

Next, in a process illustrated in FIG. 13, an N-type impurity is ion-implanted into the semiconductor substrate 3 using the silicon oxide film 5, in which an opening OP1 for forming the impurity region 4 is provided, as an implantation mask to form the impurity region 4.

Figure 14:
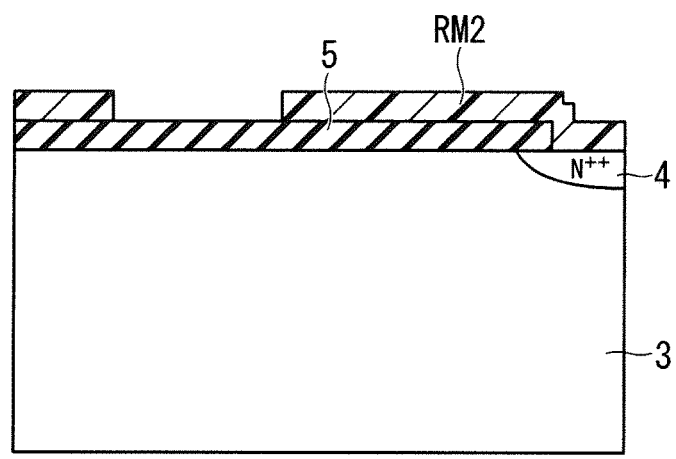

Next, in a process illustrated in FIG. 14, a resist mask RM2 for further patterning the silicon oxide film 5 is formed by photolithography.

Next, in a process illustrated in FIG. 15, the silicon oxide film 5 is patterned by etching using the resist mask RM2, and subsequently, the resist mask RM2 is removed. Through this process, the silicon oxide film 51 on the region from the guard ring 17 to the end edge part on the inner side of the RESURF layer 18 is patterned.

Figure 16:
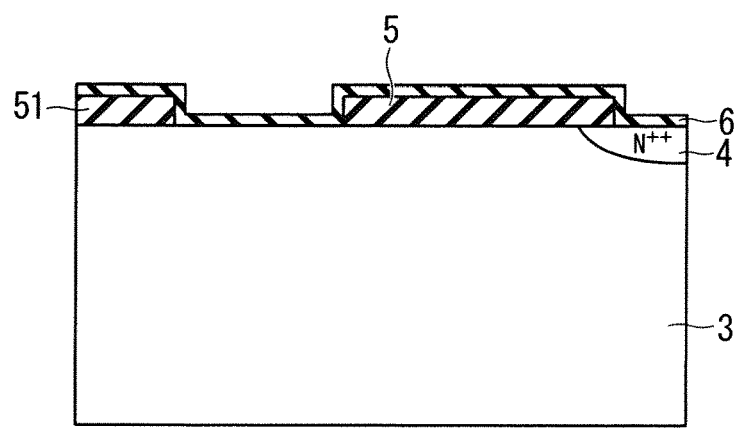

Next, in a process illustrated in FIG. 16, the semi-insulating film 6 of silicon nitride is formed by chemical vapor deposition (CVD), for example, to cover the silicon oxide film 5 and the semiconductor substrate 3.

Figure 17:
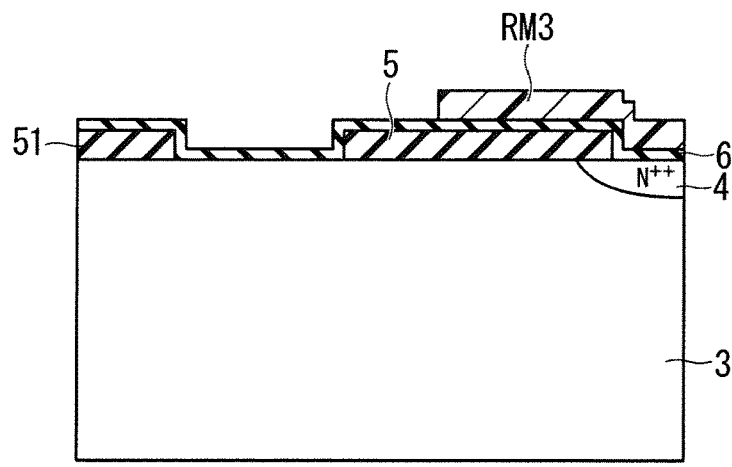

Next, in a process illustrated in FIG. 17, a resist mask RM3 for patterning the semi-insulating film 6 is formed on the semi-insulating film 6 by photolithography. The resist mask RM3 formed herein has a pattern so that the semi-insulating film 6 remains on a region from the outer end edge part of the silicon oxide film 5 to the impurity region 4.

Next, in a process illustrated in FIG. 18, the semi-insulating film 6 is patterned by etching using the resist mask RM3, and subsequently, the resist mask RM3 is removed.

Figure 19:
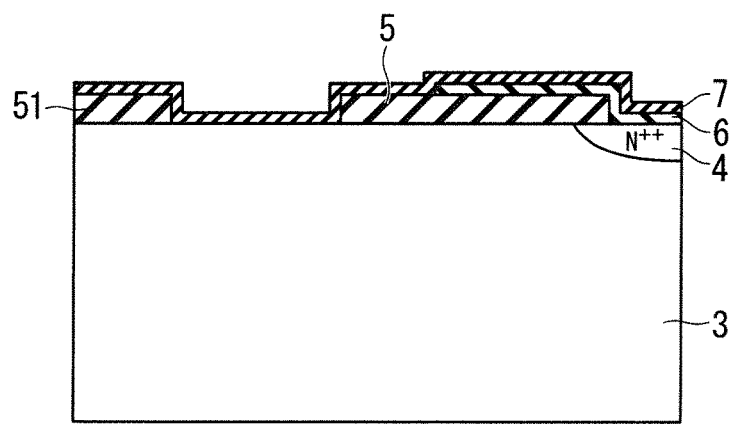
Figure 20:
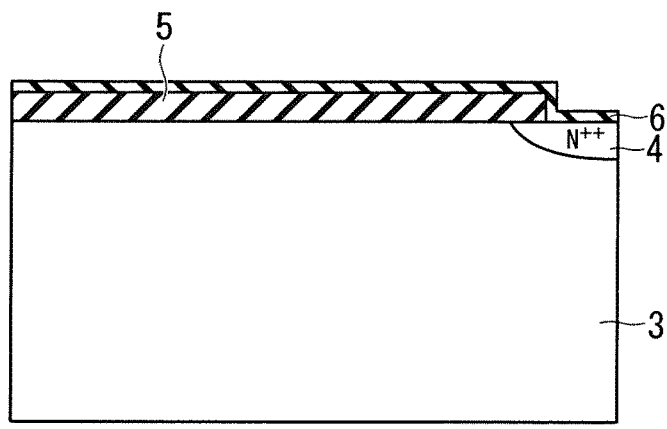

Next, in a process illustrated in FIG. 19, the semi-insulating film 7 of silicon nitride is formed by CVD, for example, to cover the semi-insulating film 6, the silicon oxide film 5, the semiconductor substrate 3, and the silicon oxide film 5, thus the semi-insulating film 6 and the semi-insulating film 7 are formed.

Figure 15:
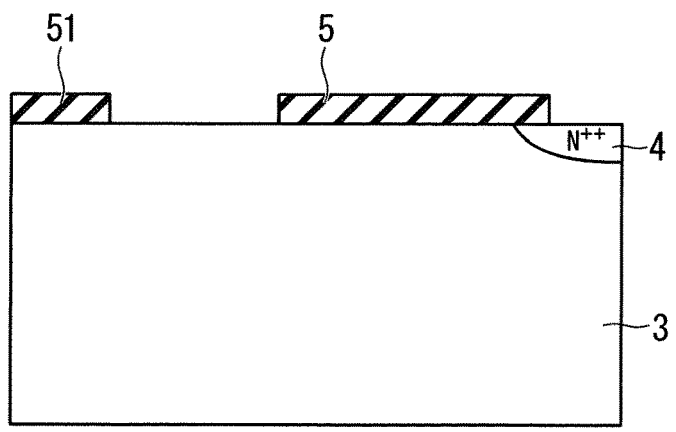
Figure 18:
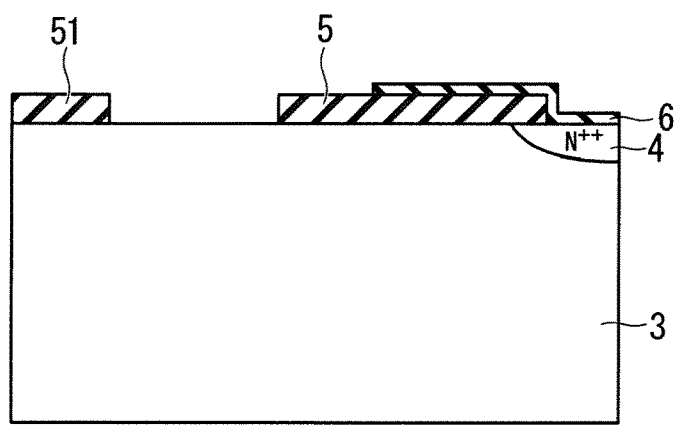

Applicable in the etching process described using FIG. 15 and FIG. 18 is plasma etching by a reactive gas, wet etching by a chemical medical solution, or etching combining these two methods.

Figure 11:
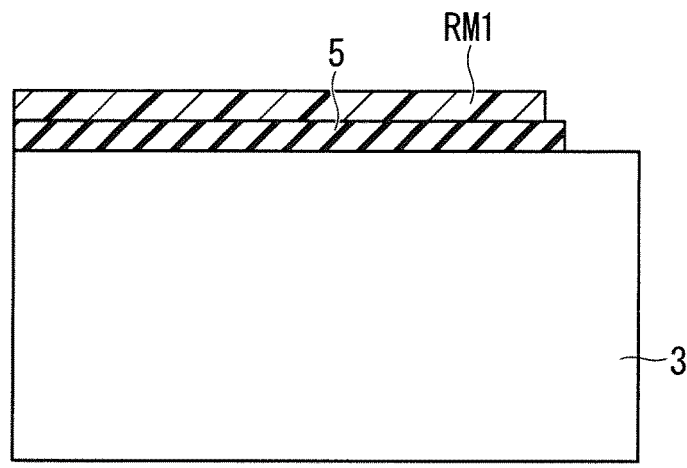
FIGS. 11 to 24 are cross-sectional views for explaining a method of manufacturing a semi-insulating film.

As described using FIG. 11, FIG. 14, and FIG. 17, three processes of photolithography are necessary to form the semi-insulating film 6 and the semi-insulating film 7, however, when a selective etching can be performed on the semi-insulating film 6 and the silicon oxide film 5 depending on types of reactive gas or chemical medical solution, the semi-insulating film 6 is used as an etching mask of the silicon oxide film 5, thus the photolithography process described using FIG. 17 can be omitted, and the semi-insulating film 6 and the semi-insulating film 7 can be formed with two photolithography processes.

A manufacturing method of forming the semi-insulating film 6 and semi-insulating film 7 with the two photolithography processes is described hereinafter using FIG. 20 to FIG. 24.

Figure 12:
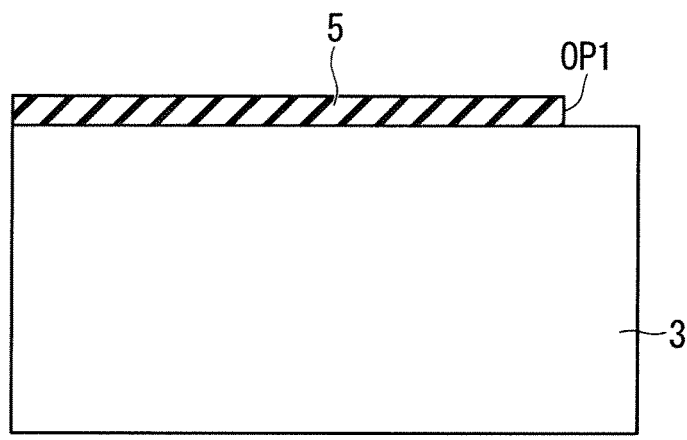

Firstly, the impurity region 4 is formed in the semiconductor substrate 3 through the processes described using FIG. 11 to FIG. 13. Subsequently, in a process illustrated in FIG. 20, the semi-insulating film 6 of silicon nitride is formed by CVD, for example, to cover the silicon oxide film 5 and the semiconductor substrate 3.

Figure 21:
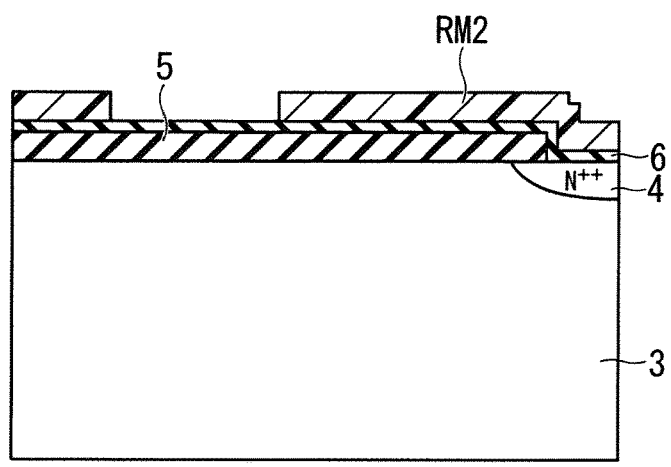

Next, in a process illustrated in FIG. 21, a resist mask RM2 for patterning the semi-insulating film 6 is formed on the semi-insulating film 6 by photolithography. The resist mask RM2 formed herein has a pattern so that the semi-insulating film 6 remains on the upper part of the silicon oxide film 5 in the termination region and on the impurity region 4, and also remains on the silicon oxide film 51, which is located on a region from the guard ring 17 (not shown) to the end edge part on the inner side of the RESURF layer 18 (not shown), and the end edge part of the cell region CR.

Figure 22:
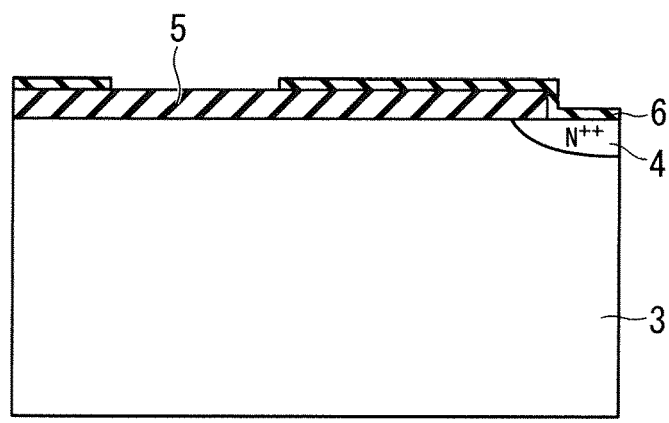

Next, in a process illustrated in FIG. 22, the semi-insulating film 6 is patterned by etching using the resist mask RM2, and subsequently, the resist mask RM2 is removed.

Figure 23:
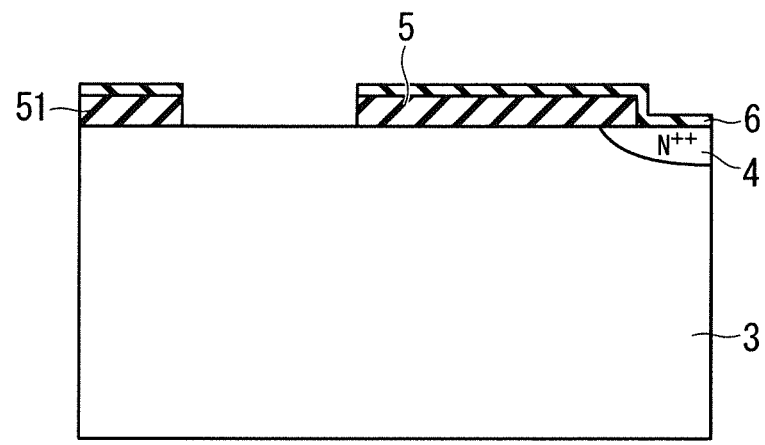

Next, in a process illustrated in FIG. 23, the silicon oxide film 5 is patterned by etching using the patterned the semi-insulating film 6 as a mask. Accordingly, the silicon oxide film 5 remains on the termination region and a region from the guard ring 17 (not shown) to the end edge part on the inner side of the RESURF layer 18 (not shown). The silicon oxide film 5 remaining on the region from the guard ring 17 to the end edge part on the inner side of the RESURF layer 18 becomes the silicon oxide film 51.

Figure 24:
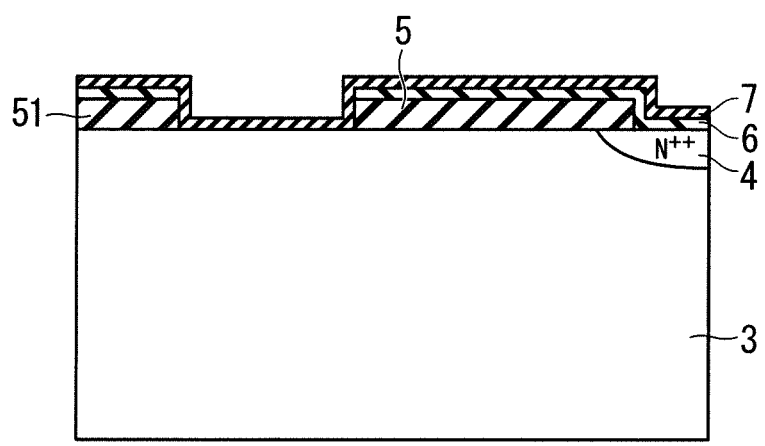

Subsequently, in a process illustrated in FIG. 24, the semi-insulating film 7 of silicon nitride is formed by CVD, for example, to cover the semi-insulating film 6 and the semiconductor substrate 3, thus the semi-insulating film 6 and the semi-insulating film 7 are formed.

When such a manufacturing method is applied, as is the case for the IGBT 100B illustrated in FIG. 10, the semi-insulating film 6 covers the region from the upper side of the silicon oxide film 5 of the termination region to the impurity region 4, and covers the silicon oxide film 51 provided on the region from the guard ring 17 to the end edge part on the inner side of the RESURF layer 18 and the end edge part of the cell region CR.

<Application to Other Semiconductor Device>

In the above embodiments 1 to 3 and modification example, the IGBT is described as the example, however, any semiconductor device having the termination region, such as a metal oxide semiconductor (MOS) transistor and various diodes, can increase the moisture resistance while keeping electrostatic withstand voltage by applying the configuration of the termination region described above.

In the above embodiments 1 to 3 and modification example, the trench gate type IGBT is described as the example, however, the configuration of the termination region described above may also be applied to a planar gate type IGBT and MOS transistor.

According to the present invention, the above embodiments can be arbitrarily combined, or each embodiment can be appropriately varied or omitted within the scope of the invention.

What is claimed is:

1. A semiconductor device in which a main current flows in a thickness direction of a semiconductor substrate, wherein the semiconductor substrate includes:

an active region in which the main current flows; and a termination region surrounding the active region on an outer side of the active region, and the semiconductor device includes:

a first main electrode provided on the active region;

a second main electrode provided on a side of the semiconductor substrate that is opposite to the first main electrode;

an impurity region provided on an upper layer part of the semiconductor substrate located on an outermost periphery of the termination region;

a first insulating film provided on a region from an inner end edge part of the impurity region to a partial upper side of the semiconductor substrate in an outer end edge part of the termination region;

a second insulating film provided on a region from an inner end edge part of the termination region to an end edge part of the active region;

a first semi-insulating film covering a region from a part of the impurity region which is not covered by the first insulating film to directly contact at least a partial upper side of the first insulating film; and a second semi-insulating film directly contacting the first insulating film and covering from a region of the first semi-insulating film to a partial upper side of the first main electrode, wherein the first insulating film directly contacts the semiconductor substrate, the second semi-insulating film directly contacts the semiconductor substrate in a region in the termination region between the first insulating film and the second insulating film, the first semi-insulating film and the second semi-insulating film each have conductivities higher than conductivities of the first insulating film and the second insulating film, and the first semi-insulating film and the second semi-insulating film each have a specific resistance of $10^{13}$ Ωcm or more and $10^{16}$ Ωcm or less at a voltage of 20 V and a temperature of 25° C.

2. The semiconductor device according to claim 1, wherein the first semi-insulating film covers the region from the part of the impurity region which is not covered by the first insulating film to an outer end edge part of the first insulating film.

3. The semiconductor device according to claim 1, wherein the first insulating film has a level difference in an outer end edge part of the first insulating film, the semiconductor device further includes a polysilicon film provided on the first insulating film to fill the level difference, the first semi-insulating film covers the region from the part of the impurity region which is not covered by the first insulating film to the polysilicon film and the first insulating film, and a first thickness of the first insulating film between the first semi-insulating film and the semiconductor substrate is larger than a second thickness of the first insulating film between the polysilicon film and the semiconductor substrate.

4. The semiconductor device according to claim 1, wherein the first insulating film has a level difference in an outer end edge part of the first insulating film, and covers an inner surface of a trench passing through the impurity region and reaching an inner portion of the semiconductor substrate, the semiconductor device further includes a polysilicon film provided on the first insulating film to fill the level difference and filling the trench, the first semi-insulating film covers the region from the part of the impurity region which is not covered by the first insulating film to the polysilicon film and the first insulating film, and a first thickness of the first insulating film between the first semi-insulating film and the semiconductor substrate is larger than a second thickness of the first insulating film between the polysilicon film and the semiconductor substrate.

5. The semiconductor device according to claim 1, wherein the first semi-insulating film covers the region from the part of the impurity region which is not covered by the first insulating film to a whole upper side of the first insulating film.

6. The semiconductor device according to claim 2, wherein the first semi-insulating film is also provided to cover a region from the second insulating film to the end edge part of the active region.

7. The semiconductor device according to claim 3, wherein the first semi-insulating film is also provided to cover a region from the second insulating film to the end edge part of the active region.

8. The semiconductor device according to claim 4, wherein the first semi-insulating film is also provided to cover a region from the second insulating film to the end edge part of the active region.

9. The semiconductor device according to claim 5, wherein the first semi-insulating film is also provided to cover a region from the second insulating film to the end edge part of the active region.

10. The semiconductor device according to claim 1, wherein the first semi-insulating film is formed of a resistive thin film made of silicon nitride having a composition with excess Si compared with $Si_3N_4$.

11. The semiconductor device according to claim 1, wherein the first insulating film overlaps an upper end surface of the impurity region.

12. The semiconductor device according to claim 11, wherein the first insulating film contacts the upper end surface of the impurity region.

13. The semiconductor device according to claim 1, wherein the second semi-insulating film directly contacts the semiconductor substrate from an outer edge part of the second insulating film to an inner edge part of the first insulating film.

* * * * *